United States Patent
Orr et al.

(10) Patent No.: US 7,561,439 B2
(45) Date of Patent: Jul. 14, 2009

(54) MOUNTING SLOT CONNECTOR ON MEZZANINE BOARD IN ELECTRONIC SYSTEM

(75) Inventors: Orville H. Orr, Spring, TX (US); Edgar Hance, Houston, TX (US); Ho M. Lai, Spring, TX (US); John D. Nguyen, Houston, TX (US); Minh H Nguyen, Katy, TX (US); Christian H. Post, Spring, TX (US); Karthigan Srinivasan, Houston, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 525 days.

(21) Appl. No.: 11/261,055

(22) Filed: Oct. 28, 2005

(65) Prior Publication Data

US 2007/0097660 A1    May 3, 2007

(51) Int. Cl.
    *H05K 7/02*  (2006.01)
    *H05K 7/14*  (2006.01)
(52) U.S. Cl. .............. 361/796; 361/724; 361/788; 361/752; 710/301
(58) Field of Classification Search .......... 361/683, 361/724, 796, 801, 797, 788, 730, 760, 767; 710/301; 174/520
See application file for complete search history.

(56) References Cited

U.S. PATENT DOCUMENTS

| 5,708,563 | A  | * | 1/1998  | Cranston et al. | 361/683 |
| 5,896,473 | A  | * | 4/1999  | Kaspari         | 385/24  |
| 5,987,553 | A  | * | 11/1999 | Swamy et al.    | 710/301 |
| 6,273,730 | B1 | * | 8/2001  | Chang           | 439/61  |
| 6,307,754 | B1 | * | 10/2001 | Le et al.       | 361/796 |
| 6,324,062 | B1 | * | 11/2001 | Treiber et al.  | 361/727 |
| 6,644,979 | B2 | * | 11/2003 | Huang           | 439/65  |
| 6,662,255 | B1 | * | 12/2003 | Klein           | 710/301 |
| 7,180,751 | B1 | * | 2/2007  | Geschke et al.  | 361/788 |
| 7,298,625 | B1 | * | 11/2007 | Wu et al.       | 361/735 |

OTHER PUBLICATIONS

"PMC—The New Super Mezzanine Standard," Concurrent Technologies—for CompactPCI, VME, PMC and Multibus, http://www.gocct.com/sheets/pmc.htm, 2005, p. 1-2.
Loach, Charles; "New StealthBridge® Expands CompactPCI System Capability," APW Electronic Solutions, p. 1-5.
Intel® NetStructureTM ZT 4901, Mezzanine Expansion Card, Technical Product Specification, Intel Corporation, Apr. 2005, p. 1, 2, 8, 18 and 25.

* cited by examiner

Primary Examiner—Dameon E Levi (57) ABSTRACT

A first slot connector is mounted within a housing of an electronic system and is for connecting to a first plug-in card. A mezzanine board is installed within the housing. A second slot connector is mounted on the mezzanine board for connecting to a second plug-in card. The first and second plug-in cards align with similarly-shaped slot access panels in the electronic system.

20 Claims, 5 Drawing Sheets

MOUNTING SLOT CONNECTOR ON MEZZANINE BOARD IN ELECTRONIC SYSTEM

BACKGROUND

Computers and other electronic systems commonly have "slots" into which various plug-in cards may be inserted to add functionality to the electronic systems. The plug-in cards generally have an edge card connector that plugs into a slot connector installed in the electronic system. All of the slot connectors are fixedly mounted either onto a system I/O (input/output) board or onto a riser board, which is plugged into the system I/O board.

The edge card connectors and slot connectors are designed according to various slot standards developed within relevant industries. Each slot standard generally specifies physical dimensions of the connectors and electrical signal parameters for communication across the connectors, among other criteria.

Unless specifically made to be "backwardly" compatible with earlier related standards, plug-in cards and slot connectors made according to one standard cannot be used with plug-in cards and slot connectors made according to another standard. Physical space specifications and signal timing requirements, among other features, may be quite different between different standards.

Each newly developed slot standard is generally designed to provide a variety of "improvements" over previous slot standards. For instance, a new slot standard may be developed for plug-in cards and slot connectors to take up less space than those for other standards. Another slot standard may be developed for higher communication speeds or bandwidths than those available for previous standards.

DETAILED DESCRIPTION

Since a new slot standard generally has some improvements over previous slot standards, it may be more desirable than a previous standard to users of the electronic systems. However, a maker of the electronic system takes a risk when incorporating into a new electronic system slot connections under the new slot standard at the expense of slot connections under the previous slot standard. For instance, although the users may be willing to purchase the new electronic systems to replace older less "powerful" electronic systems, some users may already have some plug-in cards that are compatible only with the previous slot standard and may not want to incur the expense of also replacing the plug-in cards. It may be difficult, therefore, for the system maker to sell the new electronic system if it only incorporates slot connectors under the new slot standard.

The system maker anticipates that the users will eventually replace the old plug-in cards, but not all right away. Therefore, there is generally a "transition period" upon the introduction of a new slot standard during which the system maker will produce electronic systems having some of the new slot connectors and some of the previous slot connectors. In this manner, the users can choose to use some of the new plug-in cards as well as some of the old ones. However, since some users may purchase the new plug-in cards immediately, while other users may hold onto the old plug-in cards, the system manufacturer has a problem deciding how many of each of the new and old slot connectors to incorporate into the new electronic system during the transition period.

Figure 1:
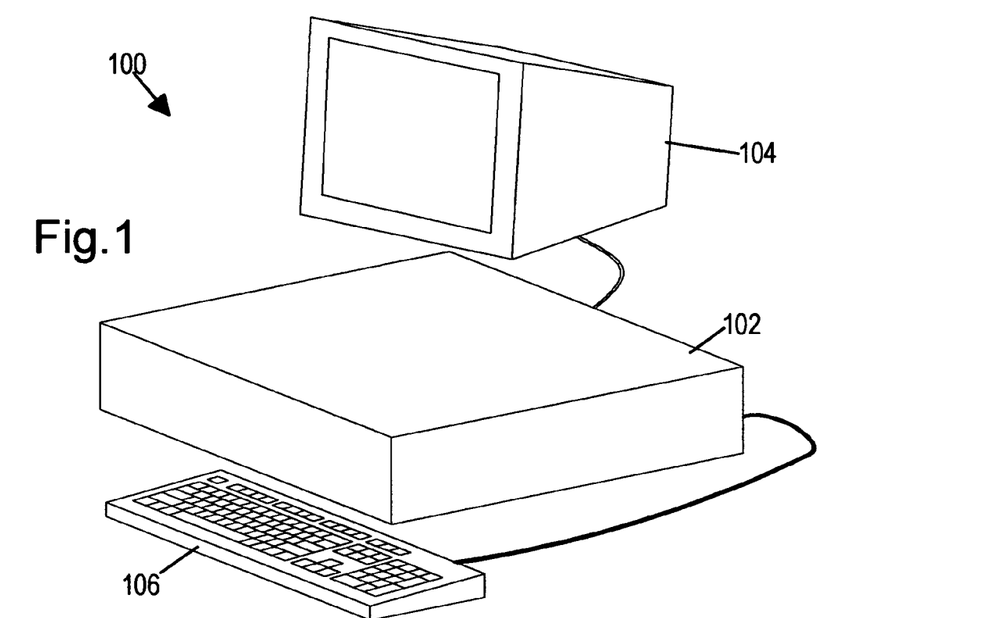
FIG. 1 is a perspective view of an exemplary computer system incorporating an embodiment of the present invention.

A computer system 100 addressing these issues and incorporating an embodiment of the present invention is shown in FIG. 1. The computer system 100 generally has elements such as a housing 102, a display 104 and a keyboard 106. Although the present invention is described with respect to its use in the computer system 100, it is understood that the invention is not so limited, but may be used in any appropriate electronic system that includes a "mezzanine board" and slot connectors as described herein, regardless of any other elements included or not included in the electronic system. Additionally, although only a single computer system 100 is shown, it is understood that alternative embodiments may include a system or enterprise in which multiple computer systems, or electronic systems, of various descriptions are incorporated. Such an alternative system may include separate individual computer systems in different housings, as well as a system having multiple computer systems or multiple system boards within a single housing, such as a rack-based system. Such computer systems 100 may be stand-alone systems that also include a display 104 and a keyboard 106, along with a housing 102. Alternatively, some of the computer systems 100 may be grouped or rack-mounted along with several other computer systems 100 in such a manner that the computer systems 100 share displays 104 and keyboards 106.

Figure 2:
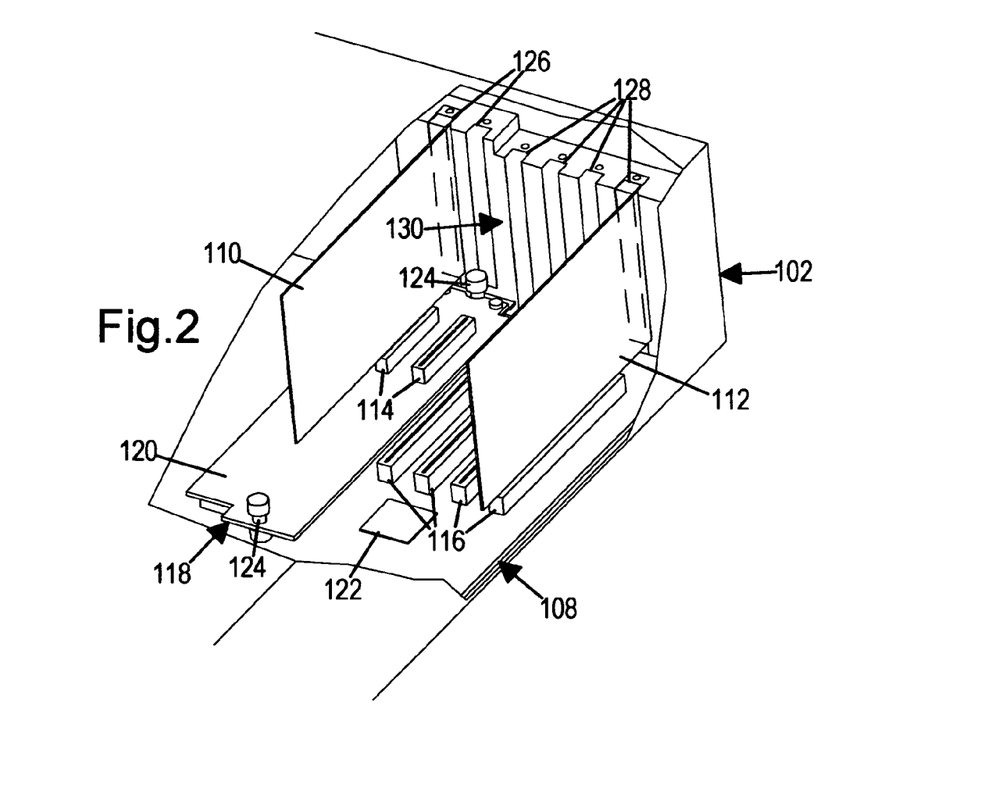
FIG. 2 is a cutaway perspective view of a portion of the computer system shown in FIG. 1 according to an embodiment of the present invention.
Figures 3, 4:
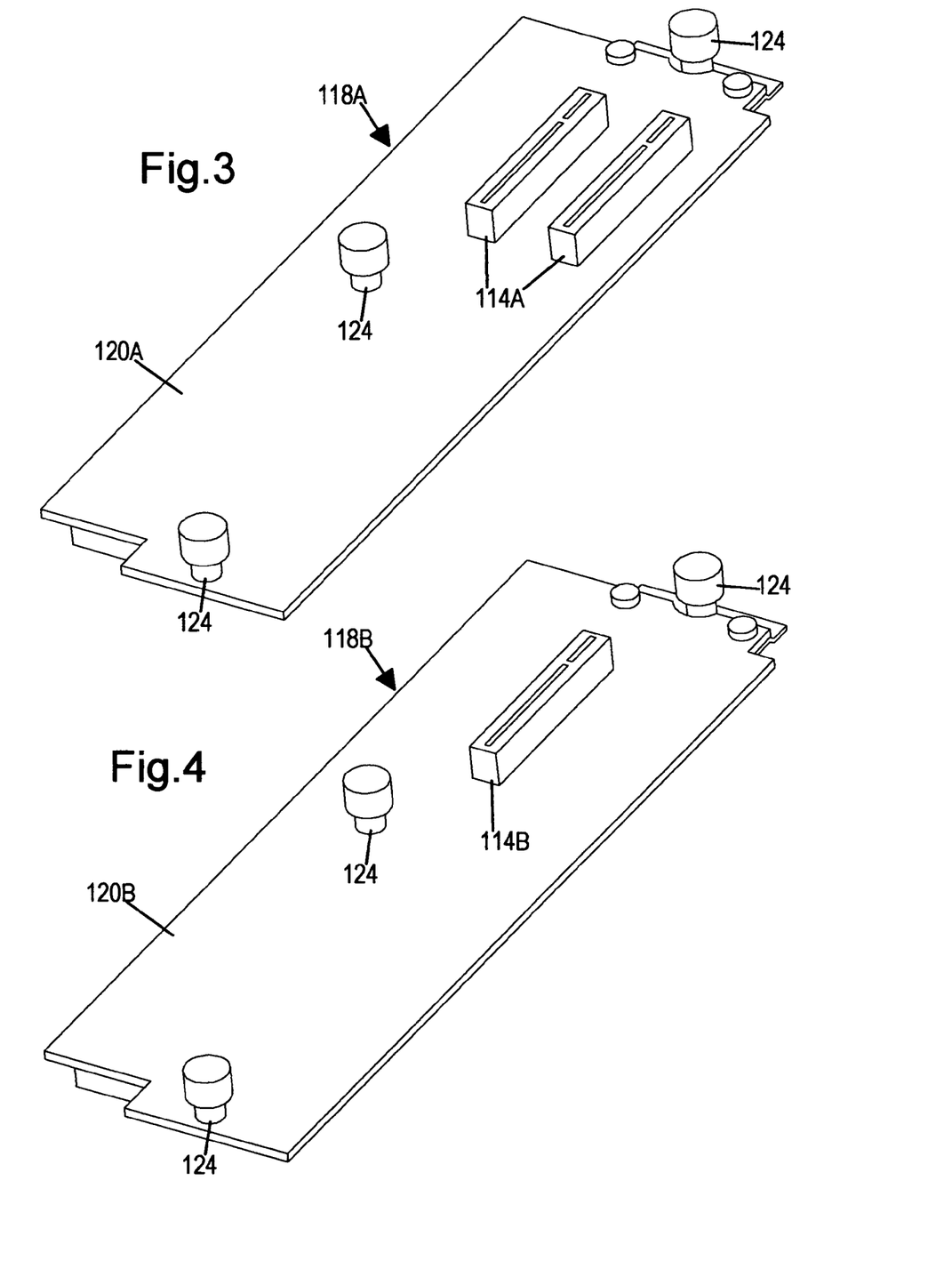
FIG. 3 is a topside perspective view of a mezzanine board for use in the computer system shown in FIG. 1 according to an embodiment of the present invention.
FIG. 4 is a topside perspective view of another mezzanine board for use in the computer system shown in FIG. 1 according to another embodiment of the present invention.

Within the housing 102, according to one embodiment as shown in FIG. 2, the computer system 100 generally includes a system I/O board (system board) 108, a variety of add-in or plug-in cards 110 and 112, a corresponding variety of slot connectors 114 and 116 and a mezzanine board 118. Some of the slot connectors 114 are mounted on a circuit board 120 of the mezzanine board 118. Other slot connectors 116 are mounted on the system board 108 along with a variety of electronic components (e.g. 122). Additionally, the slot connectors 114 and 116 may be of any appropriate type, including standard (e.g. Small Computer Systems Interface—"SCSI," Serial Attached SCSI—"SAS," Industrial Standard Architecture—"ISA," Extended ISA—"EISA," Advanced Technology Attachment—"ATA," Serial ATA—"SATA," Peripheral Component Interconnect—"PCI," PCI extended—"PCI-X," "PCI-Express," etc.) and nonstandard card interfaces to connect to peripheral devices, memory devices (e.g. dynamic random access memory—"DRAM," Synchronous DRAMs—"SDRAM," Rambus DRAMs—"RDRAM," Fully-Buffered dual in-line memory modules—"DIMMs," etc.) and other types of add-in or plug-in cards. A combination of types of slot connectors 114 and 116 within the computer system 100 is referred to herein as a "slot configuration."

Since the slot connectors 116 are mounted on the system board 108, this part of the slot configuration is fixed and cannot be changed without a very difficult and time-consuming replacement of the system board 108. The mezzanine board 118 (and, thus, the slot connectors 114 mounted thereon), however, can be removed from the housing 102 of the computer system 100, e.g. by undoing thumbscrews (or other connectors) 124 that hold the mezzanine board 118 to the system board 108. Another mezzanine board 118 having slot connectors 114 of any type can then be installed in the housing in place of the removed mezzanine board 118. (With hot-plug technology, this removal and replacement can be done while the computer system 100 is operating.) Since the slot connectors 114 are mounted on the removable mezzanine board 118, this part of the slot configuration can be quickly and easily changed to support different types of card interfaces. In this manner, the overall slot configuration of the computer system 100 is quickly and easily reconfigurable. The manufacturer and/or user of such a computer system 100 can, thus, change the slot configuration to suit a variety of needs.

The slot connectors 114 and 116 are for physically retaining and electrically connecting to the plug-in cards 110 and 112, respectively, when the plug-in cards 110 and 112 are installed in the housing 102. The plug-in cards 110 and 112 enable various functionalities for the computer system 100. Thus, the plug-in cards 110 and 112 may be any appropriate type of plug-in cards, such as, but not limited to, network interface cards, graphic cards, display adapter cards, modem cards, radio/TV tuner cards, wireless interface cards, sound adapter cards, I/O cards, memory cards, etc.

The plug-in cards 110 and 112 have edge card connectors on one edge thereof for inserting into the slot connectors 114 and 116 and for making electrical contact with electrical leads in the slot connectors 114 and 116. The plug-in card 112 communicates with the rest of the computer system 100 through its edge card connector, the slot connector 116 and the system board 108. The plug-in card 110, on the other hand, communicates with the rest of the computer system 100 through its edge card connector, the slot connector 114, the system board 108, the mezzanine board 118 and a board connector between the mezzanine board 118 and the system board 108.

The housing 102 has, among other features, slot openings (or similarly-shaped equal-spaced slot access panels) 126 and 128 in a side (or an exterior wall) 130 thereof. The slot openings 126 and 128 correspond to and align with the slot connectors 114 and 116, respectively. The slot openings 126 and 128 allow for external access to the plug-in cards 110 and 112 if required for the proper operation of the plug-in cards 110 and 112. Since the slot connectors 114 are on the mezzanine board 118, they are offset vertically (or in a direction parallel to the plug-in card 110) from the other slot connectors 116. Likewise, the slot openings 126 (aligned with the offset slot connectors 114) are similarly offset from the other slot openings 128 (aligned with the slot connectors 116).

According to various embodiments, the mezzanine board 118 may have any appropriate type and number of the slot connectors 114 mounted on the circuit board 120, as illustrated by FIGS. 3-6. For example, mezzanine board 118A (FIG. 3) has two slot connectors 114A mounted on the circuit board 120A, mezzanine board 118B (FIG. 4) has one slot connector 114B mounted on the circuit board 120B, mezzanine board 118C (FIG. 5) has two slot connectors 114C mounted on the circuit board 120C, and mezzanine board 118D (FIG. 6) has three slot connectors 114D and 114E mounted on the circuit board 120D. The number of slot connectors 114 in a given mezzanine board 118 may depend on the size of the circuit board 120 (and vice versa), as well as on a signaling capacity of an interface (described below) between the mezzanine board 118 and the system board 108. For instance, circuit board 120D is wider than circuit boards 120A-C, since it includes signal traces and any additional components that support three slot connectors 114D and 114E, instead of only one or two. On the other hand, although both circuit boards 120A and 120B may appear to have similar physical dimensions, two slot connectors 114A are mounted on circuit board 120A, while only one slot connector 114B is mounted on circuit board 120B. In such embodiments, the slot connectors 114A may be of a type that has a signaling capacity (i.e. bandwidth and clocking speed) that is half or less than that of the interface between the mezzanine board 118A and the system board 108, so it is viable to have more than one of the slot connectors 114A on the circuit board 120A. On the other hand, the slot connector 114B may be of a type that has a signaling capacity that is more than half or about equal to that of the interface between the mezzanine board 118B and the system board 108, so that it is viable to place only one such slot connector 114B on the circuit board 120B. According to a particular embodiment, therefore, the signaling capacity of the interface between the mezzanine board 118 and the system board 108 is selected to be about the same as the fastest or most powerful of the various types of slot connectors that are anticipated to be placed in the mezzanine board 118. In this manner, the interface is capable of handling the signaling requirements of any of the slower or less powerful types of slot connectors, including multiple numbers of such slot connectors, that are anticipated to be used with the mezzanine board 118.

According to some embodiments, the mezzanine board 118 (e.g. mezzanine boards 118C and 118D) also has a bridge chip 132 (FIGS. 5 and 6) mounted thereon. Such embodiments illustrate situations in which the slot connectors 114 (e.g. slot connectors 114C and 114D) are not directly compatible with the interface between the mezzanine board 118 and the system board 108. In this case, the bridge chip 132 provides a "bridge" between the signaling requirements of the slot connectors 114C and 114D and that of the interface between the mezzanine board 118 and the system board 108.

Figures 5, 6:
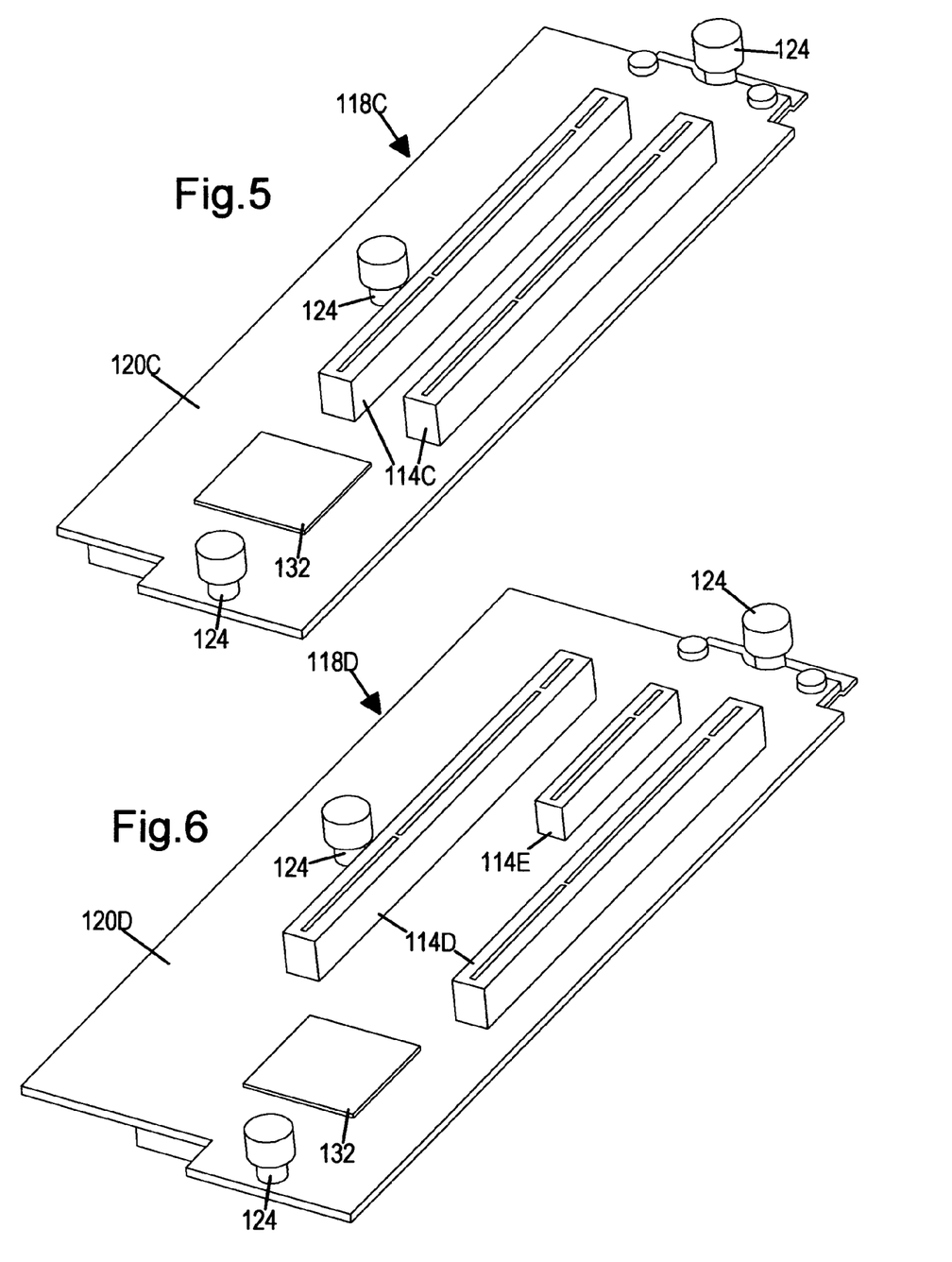
FIG. 5 is a topside perspective view of yet another mezzanine board for use in the computer system shown in FIG. 1 according to yet another embodiment of the present invention.
FIG. 6 is a topside perspective view of still another mezzanine board for use in the computer system shown in FIG. 1 according to still another embodiment of the present invention.

According to another embodiment, the mezzanine board 118 (e.g. mezzanine board 118D) also has more than one type of slot connector 114 (e.g. slot connectors 114D and 14E). In this manner, greater flexibility in the reconfigurability of the slot configuration of the computer system 100 is achieved than is possible if all of the slot connectors 114 are the same on a given mezzanine board 118.

Figure 7:
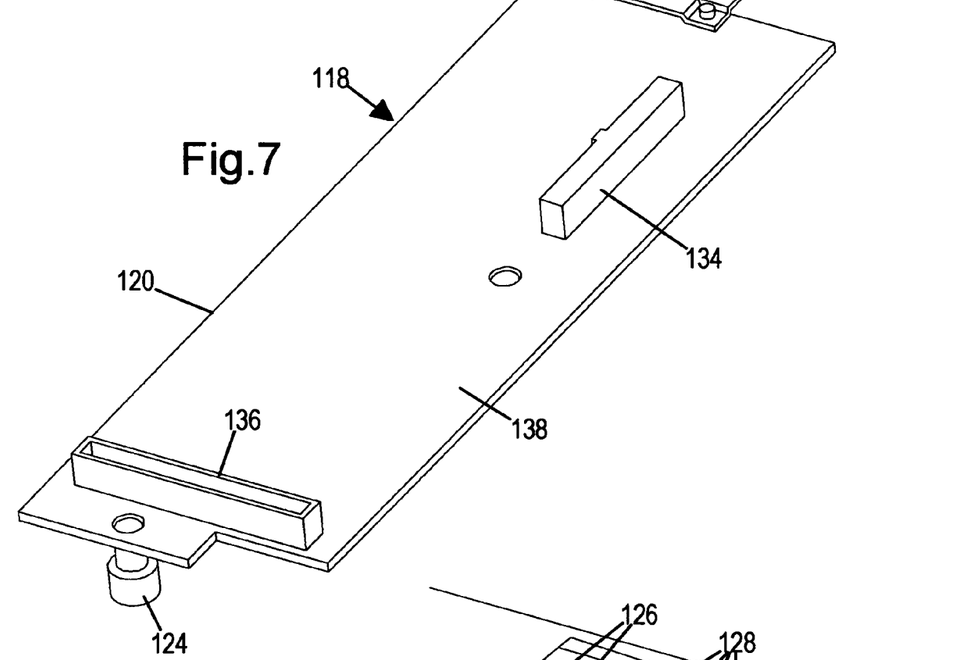
FIG. 7 is a bottomside perspective view of the mezzanine boards shown in FIGS. 3-6 according to an embodiment of the present invention.
Figure 8:
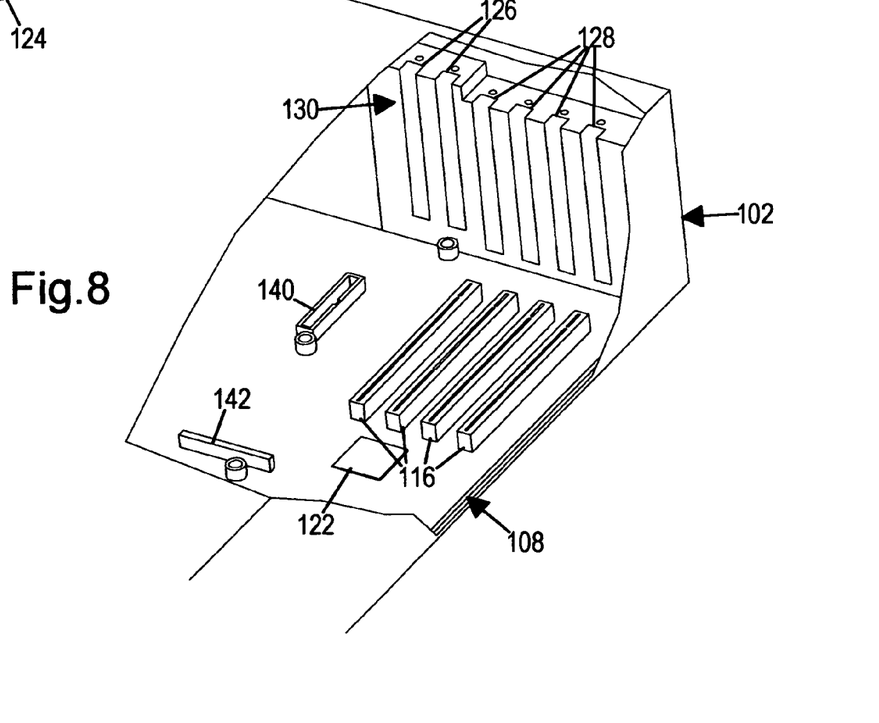
FIG. 8 is another cutaway perspective view of the portion of the computer system shown in FIG. 2 according to an embodiment of the present invention.

The mezzanine board 118, as shown in FIG. 7, generally includes one or more connectors for the interface between the mezzanine board 118 and the system board 108. Such interface connectors, according to an embodiment, include a power connector 134 and a signal connector 136 mounted on the underside 138 of the circuit board 120. Similarly, the system board 108, as shown in FIG. 8, generally includes one or more receiving connectors mounted thereon for the interface between the mezzanine board 118 and the system board 108. Such receiving interface connectors, according to this embodiment, include a receiving power connector 140 and a receiving signal connector 142. (Additionally, the system board 108 also includes threaded studs 144, or other appropriate elements, for receiving the thumb screws 124, as shown in FIGS. 2-7, of the mezzanine board 118, by which the mezzanine board 118 is held to the system board 108.) Through the power connectors 134 and 140 the mezzanine board 118 receives electrical power from the system board 108 to operate the plug-in card 110 (FIG. 2). Signaling communication between the mezzanine board 118 and the system board 108 occurs through the signal connectors 136 and 142.

Figure 9:
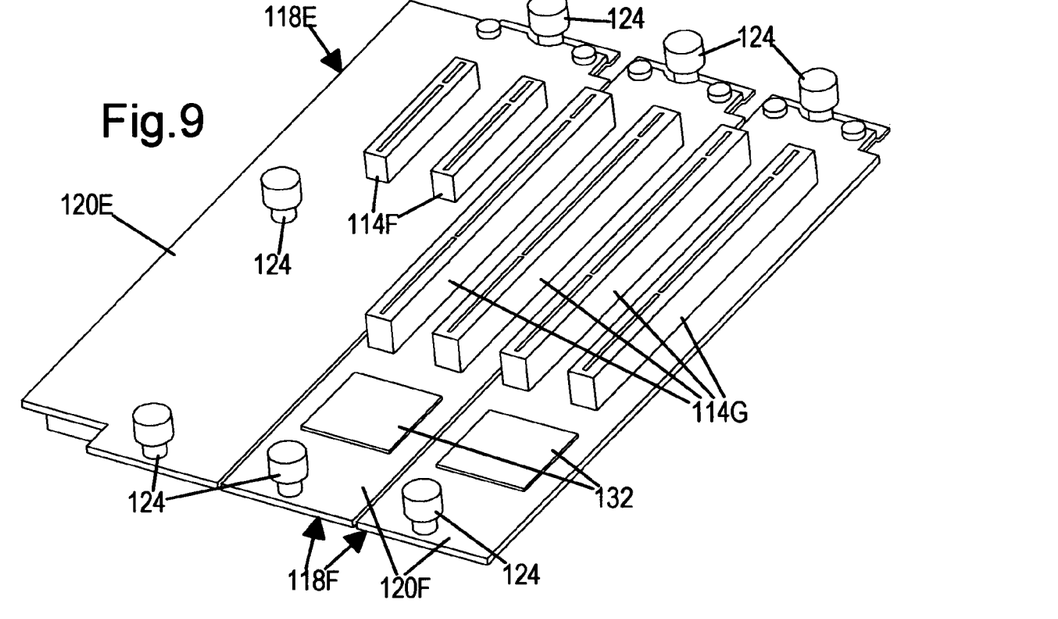
FIG. 9 is a topside perspective view of a plurality of mezzanine boards for use in the computer system shown in FIG. 1 according to an alternative embodiment of the present invention.
Figure 10:
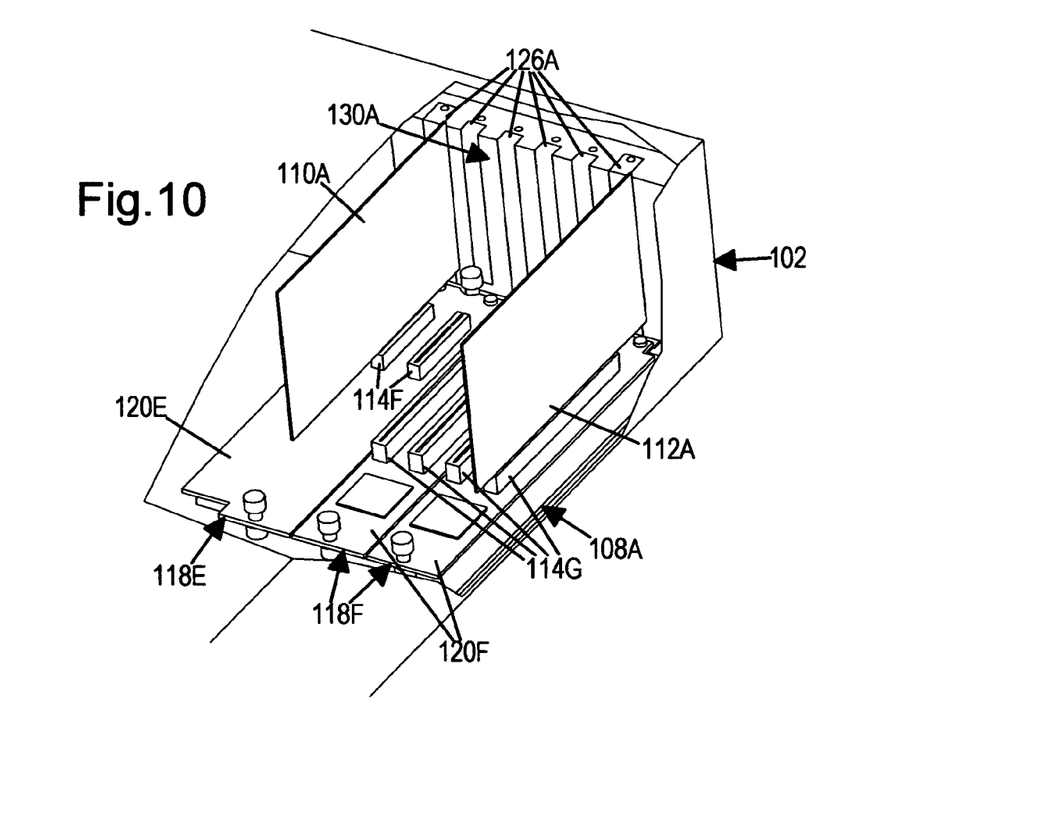
FIG. 10 is a another cutaway perspective view of a portion of the computer system shown in FIG. 1 according to an alternative embodiment of the present invention.

According to some embodiments, as shown in FIGS. 9 and 10, more than one of the mezzanine boards 118 (e.g. mezzanine boards 118E and 118F) may be connected to the system board 108A in the housing 102 of the computer system 100 (FIG. 1). The mezzanine boards 118E and 118F have any number of a variety of different types of the slot connectors 114F and 114G mounted on the circuit boards 120E and 120F for receiving the plug-in cards 110A and 112A. In this case, the system board 108A includes an appropriate number of the receiving interface connectors (i.e. the receiving power connector 140 and the receiving signal connector 142, FIG. 8) for receiving the interface connectors (i.e. the power connector 134 and the signal connector 136, FIG. 7) of the mezzanine boards 118E and 118F. Additionally, each slot opening 126A (in the side 130A of the housing 102) corresponding to a slot connector 114F and 114G mounted in a mezzanine board 118E and 118F is at the same elevation. Furthermore, many slot standards specify the spacing between slot connectors 114F and 114G, so according to some embodiments, the circuit boards 120E and 120F are designed to fit within the specified space.

According to such embodiments, each mezzanine board 118E and 118F can be removed from the housing 102 without disturbing the other mezzanine boards 118E and 118F. Additionally, such embodiments enable the manufacturer or user of the computer system 100 to quickly and easily reconfigure any one set of slot connectors 114F and 114G on any mezzanine board 118E and 118F up to potentially all of the slot connectors 114F and 114G on all of the mezzanine boards 118E and 118F, instead of only reconfiguring all or none. In this manner, maximum flexibility in the reconfigurability of the slot configuration of the computer system 100 is enabled.

We claim:

1. An electronic system comprising:
a housing;
a plurality of similarly-shaped slot access panels in an exterior wall of the housing;
a system board mounted within the housing;
a plurality of first slot connectors mounted on the system board within the housing, the plurality of first slot connectors each aligned with the slot access panels, and the plurality of first slot connectors directly connecting a first plug-in card to the system board;
a mezzanine board installed within the housing and mechanically and electrically connected via at least one of the plurality of first slot connectors to the system board;
a second slot connector mounted on the mezzanine board, the second slot connector configured to connect a second plug-in card to the mezzanine board, the second slot connector aligned with the slot access panels.

2. An electronic system as defined in claim 1, wherein:
the aforementioned mezzanine board is a first mezzanine board;
the first and second slot connectors comprise a first slot configuration for the electronic system;
the first mezzanine board is removable from the electronic system and replaceable by a second mezzanine board, which can be installed within the housing in place of the first mezzanine board;
the second mezzanine board has a third slot connector mounted thereon; and
the first and third slot connectors comprise a second slot configuration for the electronic system.

3. An electronic system as defined in claim 2, wherein:
the first mezzanine board is removable from the electronic system and replaceable by the second mezzanine board during operation of the electronic system.

4. An electronic system as defined in claim 1, wherein:
the mezzanine board is removable from the electronic system without removing the first plug-in card from the first slot connector.

5. An electronic system as defined in claim 1, wherein:
the first and second plug-in cards are offset from each other in a direction parallel to the first and second plug-in cards.

6. An electronic system as defined in claim 5, wherein:
the mezzanine board offsets the second plug-in card from the first plug-in card in the direction parallel to the first and second plug-in cards.

7. An electronic system as defined in claim 1, further comprising:
a plurality of the first slot connector mounted within the housing; and
a plurality of the second slot connector mounted on the mezzanine board.

8. An electronic system comprising:
a housing;
a plurality of similarly-shaped slot access panels in an exterior wall of the housing;
a plurality of first slot connectors disposed within the housing on a system board for connecting the system board directly to a first plug-in card that is aligned with a first one of the slot access panels; and
a second slot connector disposed within the housing on a mezzanine board for connecting a second plug-in card to the mezzanine board and in turn to the system board via one of the plurality of first slot connectors, the second plug-in card aligned with a second one of the slot access panels and that is offset from the first plug-in card in a direction parallel to the first and second plug-in-cards.

9. An electronic system comprising:
a plurality of means for holding a first plug-in card directly on a system board;
a means for holding a second plug-in card on a mezzanine board connected to one of the plurality of means for holding the first plug-in card;
a plurality of similarly-shaped means for accessing the holding means, the first plug-in card aligned with a first one of the accessing means, the second plug-in card aligned with a second one of the accessing means;
a means for mounting the first plug-in card holding means; and
a means for electrically communicating with the first plug-in card through both the mounting means and the first plug-in card holding means and with the second plug-in card through the second plug-in card holding means.

10. An electronic system as defined in claim 9, wherein the aforementioned mounting means is a first mounting means, further comprising:
a second mounting means for mounting the second plug-in card holding means;
and wherein:
the electrically communicating means electrically communicates with the first plug-in card through both the first mounting means and the first plug-in card holding means and with the second plug-in card through both the second mounting means and the second plug-in card holding means.

11. An electronic system as defined in claim 9, wherein:
the aforementioned mounting means is a first mounting means;
the first mounting means and the first plug-in card are removable from the electrically communicating means and the electronic system without removing the second plug-in card; and
the first mounting means is replaceable with a second mounting means having a means for holding a third plug-in card mounted thereon.

12. An electronic system comprising:
a housing;
a plurality of similarly-shaped slot access panels in an exterior wall of the housing;
a plurality of first slot connectors mounted within the housing for connecting a first plug-in card directly to a system board so that the first plug-in card is aligned with a first one of the slot access panels;
a first mezzanine board installed within the housing on one of the first slot connectors; and
a second slot connector mounted on the first mezzanine board for connecting to a second plug-in card that is aligned with a second one of the slot access panels;
and wherein:
the first and second slot connectors comprise a first slot configuration for the electronic system;
the first mezzanine board is removable from the electronic system and replaceable by a second mezzanine board, which can be installed within the housing in place of the first mezzanine board;
the second mezzanine board has a third slot connector mounted thereon for connecting to a third plug-in card that is aligned with the second one of the slot access panels; and
the first and third slot connectors comprise a second slot configuration for the electronic system.

13. A mezzanine board for use in an electronic system having a plurality of similarly-shaped slot access panels, comprising:
a printed circuit board; and
a slot connector mounted on a side of the printed circuit board for connecting to a plug-in card that aligns with a first one of the slot access panels when used in the electronic system;
the mezzanine board connecting via a plurality of slot connectors on a system board in the electronic system, the mezzanine board configured to receive the plug-in card in the electronic system, and at least one other plug-in card not inserted on the mezzanine board connected directly to the system board via another of the plurality of slot connectors on the system board; and
the other plug-in card aligns with a second one of the slot access panels.

14. A mezzanine board as defined in claim 13, wherein the side of the printed circuit board on which the slot connector is mounted is a first side of the printed circuit board, further comprising:
a system board connector mounted on a second side of the printed circuit board opposite the first side thereof for connecting to a system board of the electronic system.

15. A mezzanine board as defined in claim 13, wherein the aforementioned slot connector is a first slot connector and the aforementioned plug-in card is a first plug-in card, further comprising:
a second slot connector mounted on the side of the printed circuit board for connecting to a second plug-in card that aligns with a third one of the slot access panels when used in the electronic system;
and wherein, upon being installed in the electronic system, the mezzanine board enables insertion of both the first and second plug-in cards into the electronic system in addition to the at least one other plug-in card not inserted on the mezzanine board.

16. A mezzanine board as defined in claim 13, wherein:
the plug-in card can be removed from the mezzanine board and the electronic system without removing the other plug-in card.

17. A mezzanine board as defined in claim 13, wherein:
the other plug-in card is installed in another slot connector mounted on a system board of the electronic system.

18. A mezzanine board as defined in claim 13, wherein:
the other plug-in card is installed in another mezzanine board in the electronic system.

19. A method of configuring slots in an electronic system comprising:
providing an electronic system having a plurality of similarly-shaped slot access panels and a plurality of first slot connectors mounted therein for receiving a first plug-in card directly on the system board that aligns with a first one of the slot access panels; and
inserting a mezzanine board into the electronic system into another of the plurality of first slot connectors directly on the system board, the mezzanine board having a second slot connector mounted thereon for receiving a second plug-in card that aligns with a second one of the slot access panels, the first and second slot connectors comprising a slot configuration for the electronic system.

20. A method as defined in claim 19, wherein the aforementioned mezzanine board and slot configuration are a first mezzanine board and a first slot configuration, respectively, further comprising:
removing the first mezzanine board from the electronic system; and
inserting a second mezzanine board into the electronic system, the second mezzanine board having a third slot connector mounted thereon for receiving a third plug-in card that aligns with the second slot access panel, the first and third slot connectors comprising a second slot configuration for the electronic system.

* * * * *

UNITED STATES PATENT AND TRADEMARK OFFICE
CERTIFICATE OF CORRECTION

| | | |
|---|---|---|
| PATENT NO. | : 7,561,439 B2 | Page 1 of 1 |
| APPLICATION NO. | : 11/261055 | |
| DATED | : July 14, 2009 | |
| INVENTOR(S) | : Orville H. Orr et al. | |

It is certified that error appears in the above-identified patent and that said Letters Patent is hereby corrected as shown below:

In column 4, line 60, delete "14E" and insert -- 114E --, therefor.

Signed and Sealed this

Tenth Day of November, 2009

David J. Kappos
*Director of the United States Patent and Trademark Office*